United States Patent
Matsubara et al.

(10) Patent No.: US 8,311,493 B2
(45) Date of Patent: *Nov. 13, 2012

(54) RADIO APPARATUS, DISTORTION CORRECTION DEVICE, AND DISTORTION CORRECTION METHOD

(75) Inventors: Satoshi Matsubara, Kawasaki (JP); Shuya Hirata, Kawasaki (JP); Takeshi Ohba, Kawasaki (JP); Hideharu Shako, Kawasaki (JP); Jun Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 76 days.

This patent is subject to a terminal disclaimer.

(21) Appl. No.: 13/029,276

(22) Filed: Feb. 17, 2011

(65) Prior Publication Data

US 2011/0221525 A1    Sep. 15, 2011

(30) Foreign Application Priority Data

Mar. 12, 2010    (JP) .................................. 2010-056587

(51) Int. Cl.
   *H04B 1/04*    (2006.01)
   *H04B 7/00*    (2006.01)
(52) U.S. Cl. ..................... 455/114.3; 455/501; 455/63.1
(58) Field of Classification Search .................. 455/501, 455/63.1, 67.13, 114.3, 115.1
   See application file for complete search history.

(56) References Cited

U.S. PATENT DOCUMENTS

| | | | |
|---|---|---|---|
| 6,552,609 B2* | 4/2003 | Hamada et al. | 330/149 |
| 6,757,525 B1 | 6/2004 | Ishikawa et al. | |
| 7,058,369 B1 | 6/2006 | Wright et al. | |
| 7,106,133 B2* | 9/2006 | Hamada et al. | 330/149 |
| 7,190,932 B2* | 3/2007 | Irscheid et al. | 455/78 |
| 7,342,976 B2* | 3/2008 | McCallister | 375/269 |
| 7,405,680 B2* | 7/2008 | Funyu et al. | 341/118 |
| 7,742,778 B2* | 6/2010 | Husted et al. | 455/501 |
| 7,848,452 B2 | 12/2010 | Hayashi et al. | |
| 7,860,185 B2 | 12/2010 | Utsunomiya et al. | |
| 2002/0041208 A1 | 4/2002 | Hamada et al. | |
| 2003/0080814 A1 | 5/2003 | Ode et al. | |
| 2006/0215783 A1 | 9/2006 | Shako et al. | |
| 2009/0190647 A1 | 7/2009 | Utsunomiya et al. | |

FOREIGN PATENT DOCUMENTS

| | | |
|---|---|---|
| EP | 1 251 667 | 10/2002 |
| EP | 1 511 181 | 3/2005 |

(Continued)

OTHER PUBLICATIONS

European Search Report dated Jul. 15, 2011, from corresponding European Application No. 11 15 5470.

(Continued)

*Primary Examiner* — Sonny Trinh

(74) *Attorney, Agent, or Firm* — Katten Muchin Rosenman LLP

(57) ABSTRACT

An error between the power of an input signal, which is input to a power amplifier, and the power of an output signal, which is output from the power amplifier, is calculated. The calculated error is normalized according to the power of the input signal or the power of the output signal. A distortion correction coefficient, which is stored in a predetermined storage unit in association with the power of the input signal, is updated using the normalized error.

6 Claims, 9 Drawing Sheets

| FOREIGN PATENT DOCUMENTS | | |
|---|---|---|
| EP | 1 703 688 | 9/2006 |
| JP | 2003-198272 | 7/2003 |
| JP | 2005-102029 | 4/2005 |
| JP | 2006-270246 | 10/2006 |
| JP | 2009-177668 | 8/2009 |
| KR | 10-2007-0049665 | 5/2007 |
| KR | 10-2009-0082854 | 7/2009 |
| WO | 00/08870 | 2/2000 |

OTHER PUBLICATIONS

Korean Notice of Preliminary Rejection dated Apr. 20, 2012, from corresponding Korean Application No. 10-2011-17405.

* cited by examiner

RADIO APPARATUS, DISTORTION CORRECTION DEVICE, AND DISTORTION CORRECTION METHOD

CROSS-REFERENCE TO RELATED APPLICATION

This application is based upon and claims the benefit of priority of the prior Japanese Patent Application No. 2010-056587, filed on Mar. 12, 2010, the entire contents of which are incorporated herein by reference.

FIELD

The embodiments discussed herein are directed to a radio apparatus, a distortion correction device, and a distortion correction method.

BACKGROUND

In recent years, high-efficiency transmission using digitization has been employed in radio communications. Usually, a radio apparatus that performs such radio communications includes a power amplifier. The radio apparatus inputs a transmission signal to the power amplifier and then emits the transmission signal, whose power is amplified and which is output from the power amplifier, to the atmosphere via an antenna. Hereinafter, the power of the signal that is input to the power amplifier can be referred to as an "input power" and the power of the signal that is output from the power amplifier can be referred to as an "output power".

Such a power amplifier has a characteristic that, when the input power is larger than a certain value, the relation between the input power and the output power is not liner. This characteristic will be described here using FIG. 9. FIG. 9 is a graph of an example of I/O (input/output) characteristics of the power amplifier. The horizontal axis in FIG. 9 represents the power of the signal that is input to the power amplifier and the vertical axis in FIG. 9 represents the power of the signal that is output from the power amplifier.

In the example illustrated in FIG. 9, when the input power is smaller than a certain value "PX", the relation between the input power and the output power is linear. In contrast, when the input power is larger than the certain value "PX", the relation between the input power and the output power is not linear. Specifically, when the input power is larger than the certain value "PX", the output power is saturated. As described above, the I/O characteristics of the power amplifier can be divided into a "liner area" in which the relation between the input power and the output power is linear and a "non-linear area" in which the relation between the input power and the output power is not linear.

The signal that is output from the power amplifier having the above-described non-linear area contains a non-linear distortion, which leads to a problem that the communication quality deteriorates. This problem will be described here using FIG. 10. FIG. 10 is a graph of an example of frequency spectrums. The horizontal axis in FIG. 10 represents the frequency and the vertical axis in FIG. 10 represents the power. The solid line L11 in FIG. 10 represents the frequency spectrum of the signal on which power amplification is performed in the non-linear area and the dotted line L12 in FIG. 10 represents the frequency spectrum of the signal on which power amplification is performed in the linear area.

As illustrated in FIG. 10, sidelobe increases in the power of the signal on which power amplification is performed in the non-linear area compared with the power of the signal on which power amplification is performed in the liner area, and thus a power leakage to adjacent channels occurs. This is because a signal on which power amplification is performed in a non-linear area contains more non-linear distortions compared with a signal on which power amplification is performed on a liner area. Such power leakage deteriorates the communication quality of adjacent channels.

Some recent radio apparatuses include a distortion corrector that corrects a non-linear distortion contained in a transmission signal in order to prevent deterioration of the communication quality. Specifically, the distortion corrector performs a distortion correction process on an input signal, which is input to a power amplifier, using a distortion correction coefficient that is stored in a predetermined storage unit. The distortion corrector calculates an error signal between the input signal, which is input to the power amplifier, and a feedback signal, which is fed back from the power amplifier, and then multiplies the calculated error signal by a step-size parameter. The distortion corrector obtains an update value of the distortion correction coefficient by adding the multiplication result and the distortion correction coefficient, which is stored in the predetermined storage unit. The distortion corrector then updates the distortion correction coefficient, which is stored in the predetermined storage unit, to the update value.

The step-size parameter is a value for gradually updating the distortion correction coefficient and represents an updating rate of the distortion correction coefficient. In other words, the distortion corrector gradually updates the distortion correction coefficient, which is stored in the distortion correction coefficient storage unit, by multiplying the error signal between the input signal and the feedback signal by the step-size parameter.

When the step-size parameter is a large value, the variation amount of the distortion correction coefficient is large and thus the distortion correction coefficient may possibly not converge. Particularly, when the error signal is a large value, a step-size parameter that is a large value is multiplied by the error signal that is the large value. Accordingly, the variation amount of the distortion correction coefficient is large and thus the distortion correction coefficient may possibly not converge.

when the step-size parameter is a small value, the rate at which the distortion correction coefficient converges is slow. When the error signal is a small value, the step-size parameter that is a small value is multiplied by the error signal that is a small value. Accordingly, the error may be eliminated and thus the distortion correction coefficient may not be updated.

In recent years, a technology for adaptively varying the step-size parameter for each of predetermined ranges of input power has been developed. This technology may allow adaptively adjusting the rate at which the distortion correction coefficient converges for each of the predetermined ranges. A technology has been also developed in which the distortion correction coefficient is updated by dividing the complex conjugate signal of the transmission signal or the feedback signal by the amplitude value of the transmission signal or the feedback signal. This technology may realize stable convergence characteristics not depending on the amplitude level of the input signal.

Patent Document 1: Japanese Laid-open Patent Publication No. 2006-270246

Patent Document 2: Japanese Laid-open Patent Publication No. 2005-102029

However, the above-described conventional technology has a problem that the circuit scale increases. Specifically, in the conventional technology in which the step-size parameter varies for each of the predetermined ranges of the input power, multiple step-size parameters are stored and thus this leads to a problem that the memory size increases. In addition, in the conventional technology in which the complex conjugate signal is divided by the amplitude value of the transmission signal or the feedback signal, an I (in-phase component) signal and a Q (quadrature component) signal of the transmission signal, and an I signal and a Q signal of the complex conjugate signal are divided. In other words, four dividers are used to use this technology. This leads to the problem that the circuit scale increases.

SUMMARY

According to an aspect of an embodiment of the invention, a radio apparatus includes a power amplifier that amplifies a power of an input signal, a storage unit that stores a distortion correction coefficient for correcting distortion occurring in the power amplifier, the distortion correction coefficient being stored in association with power of the input signal, a distortion corrector that acquires a distortion correction coefficient corresponding to the power of the input signal from the storage unit and performs a distortion correction process on the input signal using the acquired distortion correction coefficient, a calculator that calculates an error between the power of the input signal and a power of an output signal output from the power amplifier, a normalizer that normalizes the error calculated by the calculator according to the power of the input signal or the power of the output signal, and an update unit that updates the distortion correction coefficient stored in the storage unit in association with the power of the input signal, using the error normalized by the normalizer.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. The embodiments do not limit the radio apparatus, the distortion correction device, and the distortion correction method that are disclosed by this application.

[a] First Embodiment

Figure 1:
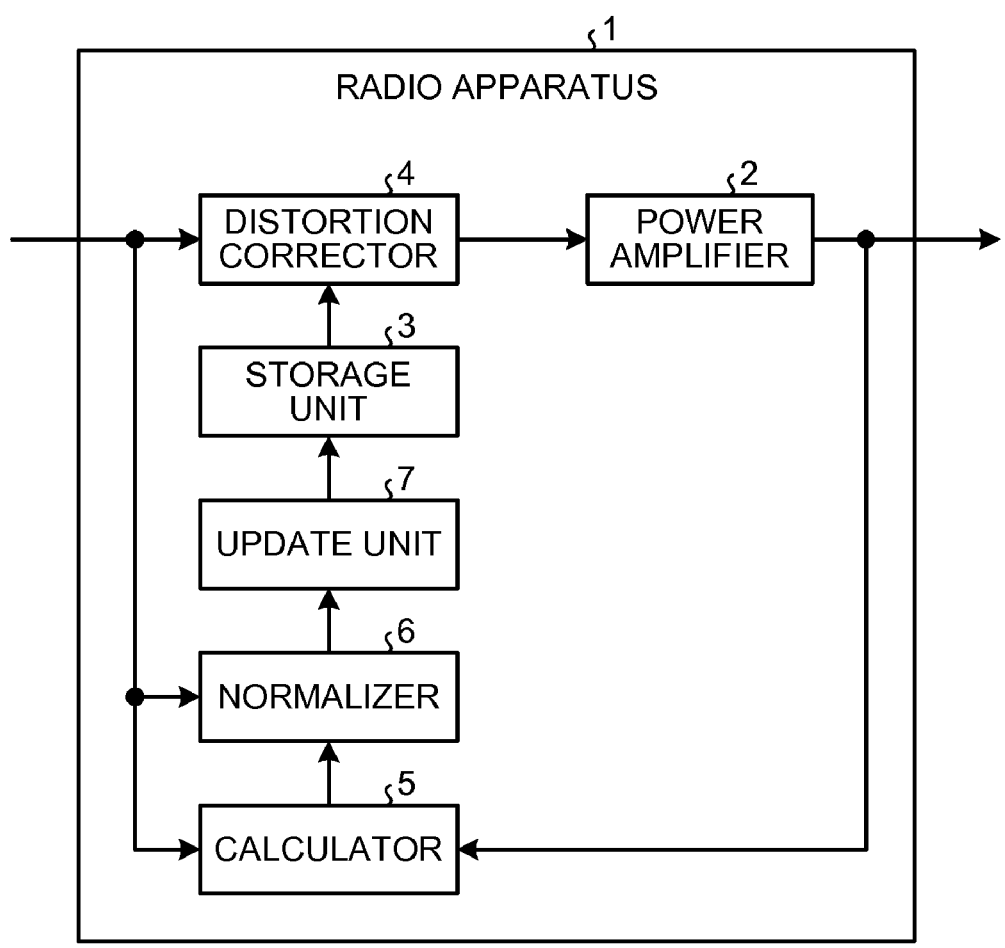
FIG. 1 is a block diagram of a configuration example of a radio apparatus according to a first embodiment.

First, a radio apparatus according to a first embodiment will be described using FIG. 1. FIG. 1 is a block diagram of a configuration example of a radio apparatus according to the first embodiment. As illustrated in FIG. 1, a radio apparatus 1 according to the first embodiment includes a power amplifier 2, a storage unit 3, a distortion corrector 4, a calculator 5, a normalizer 6, and an update unit 7.

The power amplifier 2 amplifies the power of a signal that is input. Specifically, the power amplifier 2 amplifies the power of a signal that is input from the distortion corrector 4, which will be described below. The signal whose power is amplified by the power amplifier 2 is fed back to the calculator 5. The storage unit 3 stores distortion correction coefficients for correcting distortions, which occur in the power amplifier 2, respectively in association with powers of an input signal that is input to the power amplifier 2.

The distortion corrector 4 acquires, from the storage unit 3, a distortion correction coefficient corresponding to the power of the input signal, which is input to the power amplifier 2, and performs a distortion correction process on the input signal using the acquired distortion correction coefficient. The distortion corrector 4 previously provides the input signal with a distortion corresponding to a distortion that occurs in the power amplifier 2. Accordingly, the distortion previously provided to the input signal and the distortion that occurs in the power amplifier 2 are canceled.

The calculator 5 calculates an error between the power of the input signal, which is input to the power amplifier 2, and the power of the output signal, which is output from the power amplifier 2. The normalizer 6 normalizes the error, which is calculated by the calculator 5, according to the power of the input signal, which is input to the power amplifier 2. For example, the normalizer 6 divides the error, which is calculated by the calculator 5, by the power of the input signal.

The update unit 7 updates the distortion correction coefficient, which is stored in association with the power of the input signal in the storage unit 3, using the error that is normalized by the normalizer 6. For example, the update unit 7 calculates an update value of the distortion correction coefficient using the error that is normalized by the normalizer 6. The update unit 7 then updates the distortion correction coefficient, which is stored in the storage unit 3, to the calculated update value of the distortion correction coefficient.

As described above, the radio apparatus 1 according to the first embodiment normalizes the error between the input signal, which is input to the power amplifier 2, and the output signal, which is output from the power amplifier, according to the power of the input signal. Accordingly, the radio apparatus 1 according to the first embodiment can vary the rate at which the distortion correction coefficient is updated according to the power of the input signal.

In general, when the power of the input signal, which is input to the power amplifier 2, is large, the power of the input signal and the power of the output signal are large values and thus the error between the power of the input signal and the power of the output signal tends to be large. For this reason, when the power of the input signal is large, the variation amount of the distortion correction coefficient is large and thus the distortion correction coefficient may possibly not converge, therefore, in general, it is desirable that the step-size parameter be a small value when the power of the input signal is large.

In contrast, when the power of the input signal, which is input to the power amplifier 2, is small, the power of the input signal and the power of the output signal are small values and thus the error between the power of the input signal and the power of the output signal tends to be small. For this reason, when the power of the input signal is small, if the error that is a small value is divided by a large value, the error is eliminated and accordingly the distortion correction coefficient is not updated. For this reason, in general, it is desirable that the step-size parameter be a large value when the power of the input signal is small.

The radio apparatus 1 according to the first embodiment normalizes the error between the power of the input signal and the power of the output signal according to the power of the input signal. In other words, when the power of the input signal is large, the radio apparatus 1 normalizes the error according to the power that is a large value. In addition, when the power of the input signal is small, the radio apparatus 1 normalizes the error according to the power that is a small value.

For example, it is assumed that the radio apparatus 1 according to the first embodiment divides the error between the power of the input signal and the power of the output signal by the power of the input signal. In this case, when the power of the input signal is large, because the radio apparatus 1 divides the error by the power that is a large value, the variation amount of the distortion correction coefficient can be small. When the power of the input signal is small, because the radio apparatus 1 divides the error by the power that is a small value, the error can be prevented from being eliminated and accordingly the distortion correction coefficient can be prevented from being not updated.

The radio apparatus 1 according to the first embodiment normalizes the error between the power of the input signal and the power of the output signal according to the power of the input signal, therefore, the radio apparatus 1 can be realized by adding only one divider. Accordingly, the radio apparatus 1 according to the first embodiment can perform the distortion correction coefficient update process suitable for an input power using a small-scale circuit.

[b] Second Embodiment

Configuration of Radio Apparatus According to Second Embodiment

Figure 2:
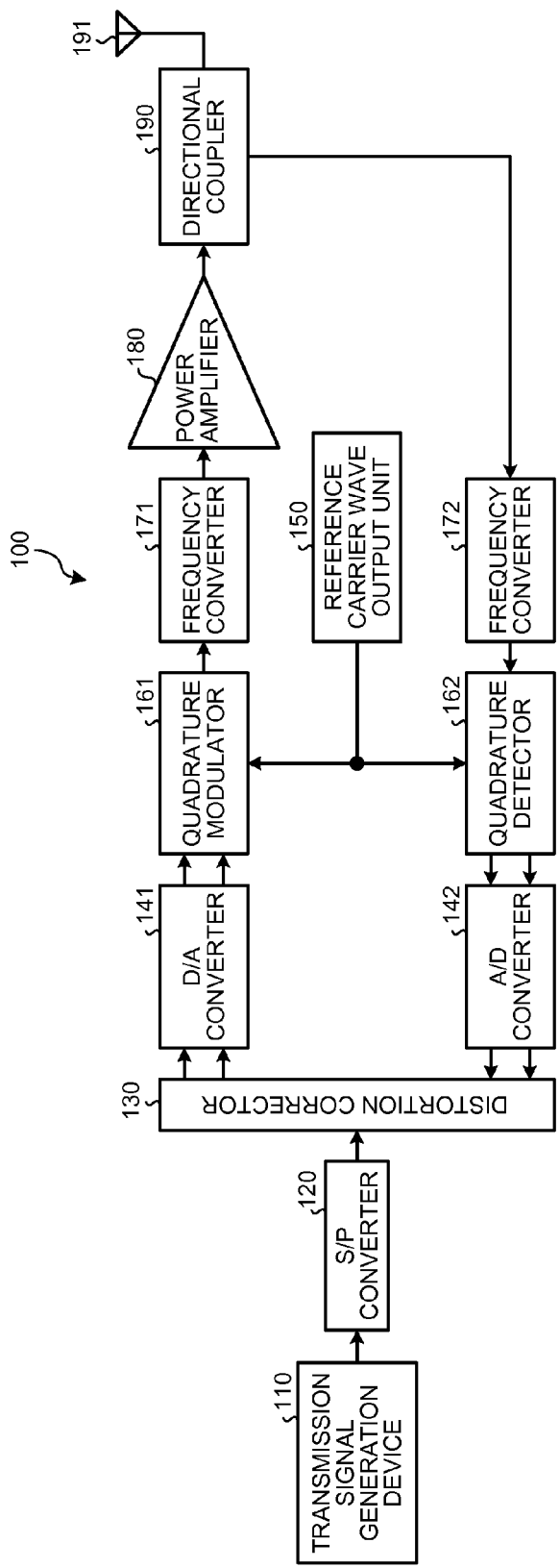
FIG. 2 is a block diagram of a configuration example of a radio apparatus according to a second embodiment.

A configuration of the radio apparatus according to the second embodiment will be described below using FIG. 2. FIG. 2 is a block diagram of a configuration example of the radio apparatus according to the second embodiment. A radio apparatus 100 in FIG. 2 is, for example, a radio base station or an RRH (remote radio head). As illustrated in FIG. 2, the radio apparatus 100 includes a transmission signal generation device 110, an S/P (serial/parallel) converter 120, a distortion corrector 130, a D/A (digital/analog) converter 141, a reference carrier wave output unit 150, a quadrature modulator 161, and a frequency converter 171.

The transmission signal generation device 110 generates a transmission signal and outputs the transmission signal to the S/P converter 120. Specifically, the transmission signal generation device 110 outputs a serial data stream to the S/P converter 120.

The S/P converter 120 sorts the serial digital data stream, which is input from the transmission signal generation device 110, alternately on a bit basis and converts the serial digital data stream into two sequences of data streams: an in-phase component signal (I signal) and a quadrature component signal (Q signal). The S/P converter 120 outputs the I signal and the Q signal to the distortion corrector 130. Any of the I signal and Q signal can be simply referred to as a "transmission signal" below.

The distortion corrector 130 performs a distortion correction process on the transmission signal that is input from the S/P converter 120. The distortion corrector 130 outputs the transmission signal, on which the distortion correction process is performed, to the D/A converter 141. The process performed by the distortion corrector 130 will be described below using FIGS. 3 and 4.

The D/A converter 141 converts the digital transmission signal, which is input from the distortion corrector 130, to an analog baseband signal. The D/A converter 141 outputs the transmission signal, on which the D/A conversion is performed, to the quadrature modulator 161.

The reference carrier wave output unit 150 outputs a signal whose frequency band is of a carrier wave to the quadrature modulator 161 and a quadrature detector 162, which will be described below. The quadrature modulator 161 multiplies the I signal, which is a transmission signal input from the D/A converter 141, by the reference carrier wave, which is input from the reference carrier wave output unit 150. The quadrature modulator 161 also multiplies the Q signal, which is a transmission signal input from the D/A converter 141, by a signal obtained by shifting the phase of the reference carrier wave by 90 degrees. The quadrature modulator 161 then performs a quadrature modulation by adding the result of the multiplication of the I signal and the result of the multiplication of the Q signal. The quadrature modulator 161 then outputs the transmission signal, on which the quadrature modulation is performed, to the frequency converter 171.

The frequency converter 171 performs a frequency conversion on the transmission signal, on which the quadrature modulation is performed and which is input from the quadrature modulator 161, by mixing the transmission signal and a locally-generated signal that is output from a local oscillator (not illustrated in the drawings). The frequency converter 171 then outputs the transmission signal, on which the frequency conversion is performed, to a power amplifier 180.

As illustrated in FIG. 2, the radio apparatus 100 includes the power amplifier 180, a directional coupler 190, an antenna 191, a frequency converter 172, the quadrature detector 162, and an A/D (analog/digital) converter 142.

The power amplifier 180 amplifies the power of the transmission signal that is input from the frequency converter 171 and outputs the transmission signal whose power is amplified to the directional coupler 190. The directional coupler 190 is, for example, a coupler. The directional coupler 190 outputs the transmission signal, which is input from the power amplifier 180, to the antenna 191 and the frequency converter 172. The signal that is output from the directional coupler 190 to the frequency converter 172 can be referred to as a "feedback signal" below. The antenna 191 emits the transmission signal, which is input from the directional coupler 190, to the atmosphere.

The frequency converter 172 converts the frequency of the feedback signal, which is input from the directional coupler 190. The frequency converter 172 then outputs the feedback signal, on which the frequency conversion is performed, to the quadrature detector 162.

The quadrature detector 162 performs quadrature detection by multiplying the feedback signal, which is input from the frequency converter 172, by the reference carrier wave, which is input from the reference carrier wave output unit 150, and by multiplying the feedback signal by the reference carrier wave whose phase is shifted by 90 degrees. Accordingly, the quadrature detector 162 reproduces the I signal and the Q signal of the baseband. The quadrature detector 162 then outputs the I signal and the Q signal to the A/D converter 142.

The A/D converter 142 coverts the I signal and the Q signal, which are input from the quadrature detector 162, to digital signals and outputs the I signal and the Q signal, on which the A/D conversion is performed, to the distortion corrector 130. In this manner, the directional coupler 190, the frequency converter 172, the quadrature detector 162, and the A/D converter 142 feed back, to the distortion corrector 130, the signal that is output from the power amplifier 180.

Configuration of Distortion Corrector of Second Embodiment

Figure 3:
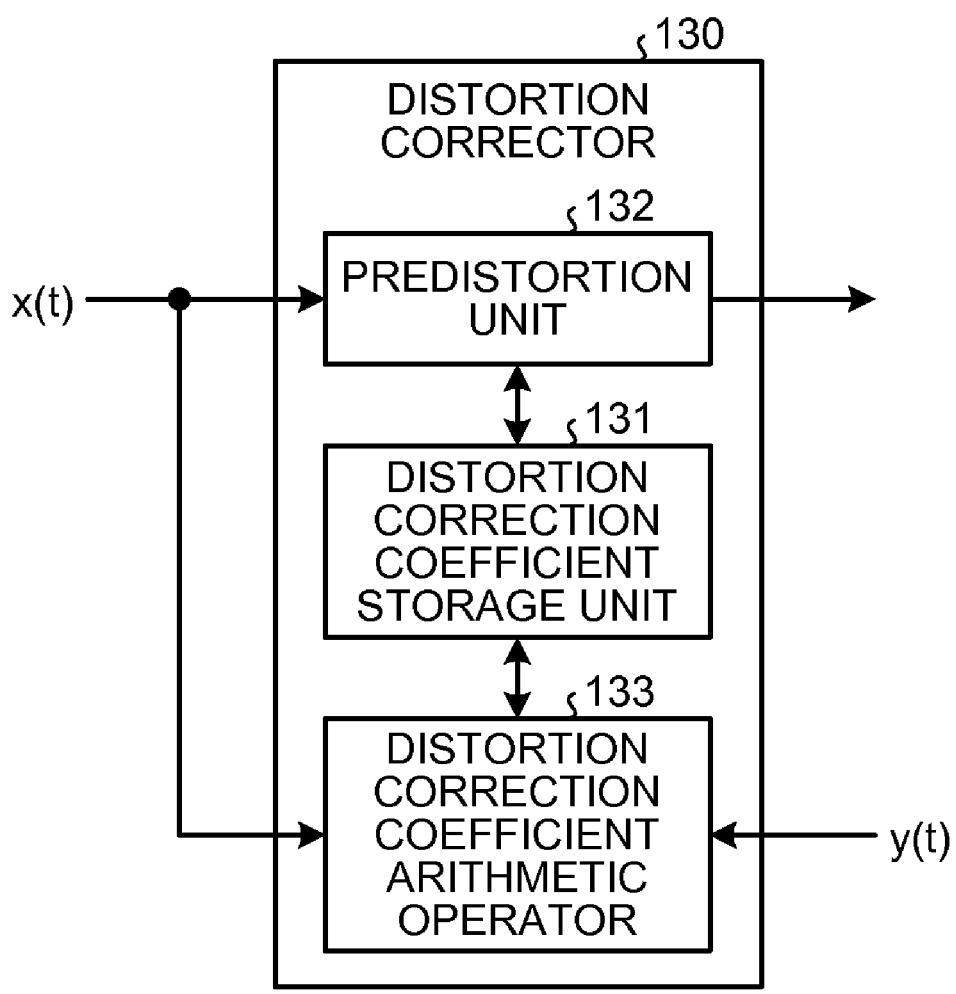
FIG. 3 is a block diagram of a configuration example of a distortion corrector of the second embodiment.

A configuration of the distortion corrector 130 of the second embodiment will be described here using FIG. 3. FIG. 3 is a block diagram of a configuration example of the distortion corrector 130 of the second embodiment. As illustrated in FIG. 3, the distortion corrector 130 includes a distortion correction coefficient storage unit 131, a predistortion unit 132, and a distortion correction coefficient arithmetic operator 133.

The distortion correction coefficient storage unit 131 stores a distortion correction coefficient h(i) corresponding to a power pi of a transmission signal x(t) that is input from the S/P converter 120 to the distortion corrector 130. The value i of the power pi ranges, for example, from 0 to 1023. In this case, the distortion correction coefficient storage unit 131 stores a distortion correction coefficient h(0) to h(1023) corresponding to the a power p0 to p1023 of the transmission signal x(t). The distortion correction coefficient storage unit 131 corresponds to, for example, the storage unit 3 in FIG. 1.

The predistortion unit 132 performs a distortion correction process (predistortion) on the transmission signal x(t). Specifically, the predistortion unit 132 acquires a distortion correction coefficient h(i) corresponding to the power pi of the transmission signal x(t) from the distortion correction coefficient storage unit 131 and performs the distortion correction process on the transmission signal x(t) using the acquired distortion correction coefficient h(i). The predistortion unit 132 corresponds to, for example, the distortion corrector 4 in FIG. 1.

The distortion correction coefficient arithmetic operator 133 calculates an update value of the distortion correction coefficient h(i) according to the transmission signal x(t) and a feedback signal y(t), which is input from the A/D converter 142. The distortion correction coefficient arithmetic operator 133 then updates the distortion correction coefficient corresponding to the power pi in the distortion correction coefficient storage unit 131 to the update value.

Specifically, the distortion correction coefficient arithmetic operator 133 compares the transmission signal x(t) and the feedback signal y(t) by an applicable signal process using an LMS (least mean square) algorithm. The distortion correction coefficient arithmetic operator 133 divides an error signal e(t) between the transmission signal x(t) and the feedback signal y(t) by the power pi of the transmission signal x(t). The distortion correction coefficient arithmetic operator 133 multiplies the division result by a step-size parameter $\mu$.

The distortion correction coefficient arithmetic operator 133 acquires a distortion correction coefficient corresponding to the transmission signal x(t) from the distortion correction coefficient storage unit 131 and then calculates a distortion correction coefficient h(i) by adding the acquired distortion correction coefficient and the multiplication result $\mu \cdot e(t)$. The distortion correction coefficient arithmetic operator 133 corresponds to, for example, the calculator 5, the normalizer 6, and the update unit 7 in FIG. 1.

Figure 4:
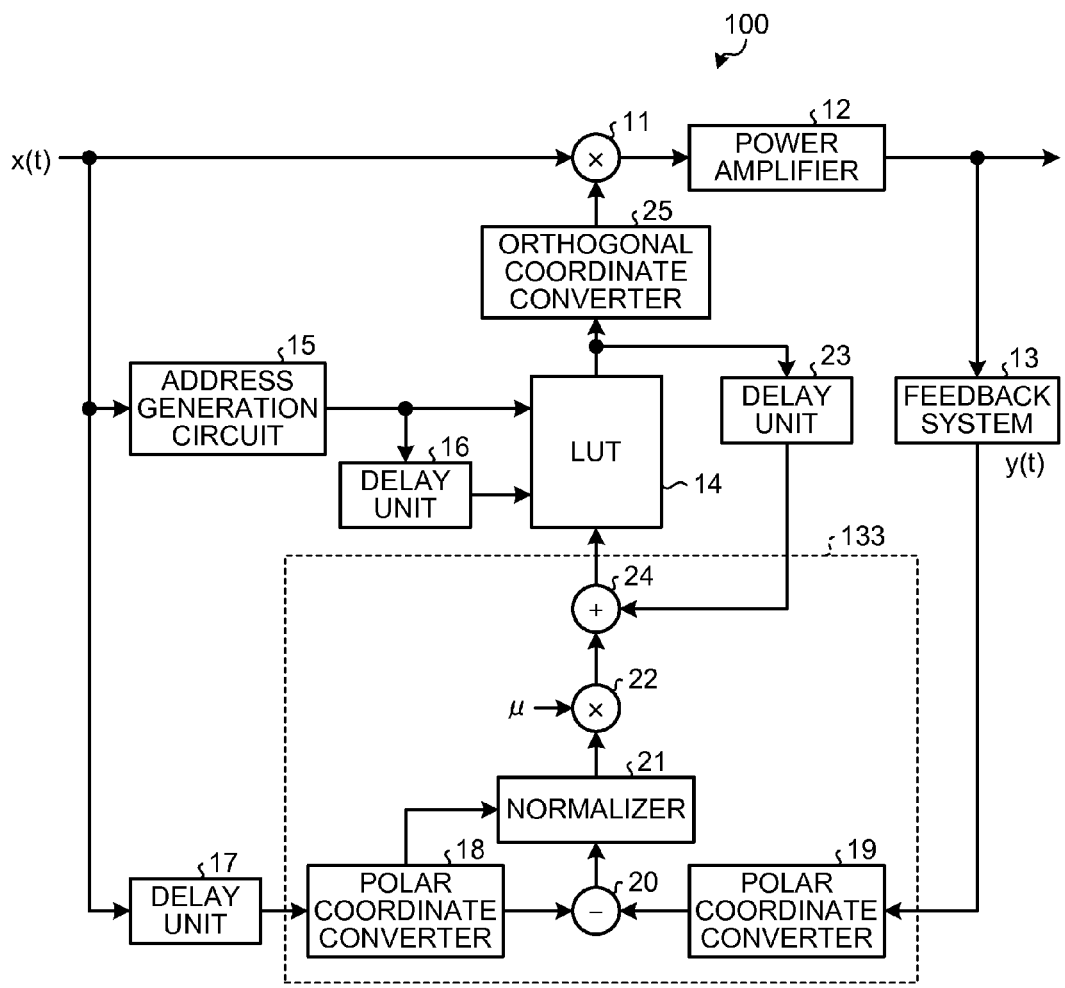
FIG. 4 is a block diagram of an example of a detailed configuration of the radio apparatus according to the second embodiment.

A configuration of the distortion corrector 130 in FIG. 3 will be described in more detail below here using FIG. 4. FIG. 4 is a block diagram of an example of a detailed configuration of the radio apparatus 100 according to the second embodiment. The transmission signal generation device 110, the S/P converter 120, the D/A converter 141, the quadrature modulator 161, the frequency converter 171, the antenna 191, and so forth among the units in FIG. 2 are omitted from FIG. 4.

As illustrated in FIG. 4, the radio apparatus 100 includes a multiplier 11, a power amplifier 12, a feedback system 13, an LUT (lookup table) 14, an address generation circuit 15, a delay unit 16, and a delay unit 17. The multiplier 11 corresponds to, for example, the predistortion unit 132 in FIG. 3. The power amplifier 12 corresponds to, for example, the power amplifier 180 in FIG. 2. The feedback system 13 corresponds to, for example, the frequency converter 172, the quadrature detector 162, and the A/D converter 142 in FIG. 2. The LUT 14 corresponds to, for example, the distortion correction coefficient storage unit 131 in FIG. 3.

The multiplier 11 multiplies the transmission signal x(t), which is input from the S/P converter 120, by the distortion correction coefficient h(i) corresponding to the power pi of the transmission signal x(t). In this manner, the multiplier 11 performs the distortion correction process on the transmission signal x(t). The multiplier 11 acquires the distortion correction coefficient h(i) corresponding to the power pi of the transmission signal x(t) from the LUT 14, which will be described below.

The power amplifier 12 amplifies the power of the transmission signal, which is input from the multiplier 11. The transmission signal whose power is amplified by the power amplifier 12 is output to the antenna (not illustrated) and the feedback system 13.

As described above, the feedback system 13 corresponds to the frequency converter 172, the quadrature detector 162, and the A/D converter 142 in FIG. 2. The feedback system 13 outputs, as the feedback signal y(t), the transmission signal whose power is amplified by the power amplifier 12 to the polar coordinate converter 19.

The LUT 14 stores distortion correction coefficients for correcting distortions, which occur in the power amplifier 12, in address positions each corresponding to each discrete power of the transmission signal x(t). The LUT 14 may store the distortion correction coefficients in two-dimensional address positions each corresponding to each discrete power of the transmission signal x(t). The LUT 14 stores an x-axis direction address uniquely corresponding to the power pi of the transmission signal x(t) and a y-axis direction address uniquely corresponding to a difference $\Delta P$ between the power pi of the transmission signal x(t) and a power pi of a transmission signal x(t−1). The LUT 14 may store the distortion correction coefficients in address positions each determined by a combination of the x-axis direction address and the Y-axis direction address. The LUT 14 may store the distortion correction coefficients in address positions each determined by a combination of the x-axis direction address and the Y-axis direction address, which are described above, and a Z-axis address uniquely corresponding to other information.

The address generation circuit 15 calculates the power pi of the transmission signal x(t) and generates an address uniquely corresponding to the power pi, which is the result of the arithmetic operation. When the LUT 14 stores the distortion correction coefficients in the two-dimensional address positions as in the above-described example, the address generation circuit 15 calculates the power pi of the transmission signal x(t) and generates an X-axis direction address uniquely corresponding to the power pi, which is the result of the arithmetic operation. The address generation circuit 15 generates the Y-axis direction address uniquely corresponding to the difference ΔP between the power pi of the transmission signal x(t) and the previous power pi of a transmission signal x(t−1).

The delay unit 16 delays the address that is generated by the address generation circuit 15 and then outputs the address to the LUT 14. For example, the delay unit 16 delays the address, which is input from the address generation circuit 15, for a period of time from when the transmission signal x(t) is input to the address generation circuit 15 until the feedback signal y(t) is input to a subtractor 20, and then the delay unit 16 outputs the address to the LUT 14.

The address that is input from the address generation circuit 15 to the LUT 14 is a read address of the distortion correction coefficient used for the multiplier 11. Specifically, the LUT 14 outputs the distortion correction coefficient, which corresponds to the address input from the address generation circuit 15, to an orthogonal coordinate converter 25. The multiplier 11 performs the distortion correction process by multiplying the transmission signal x(t) by the distortion correction coefficient, that is an orthogonal coordinate system signal converted from a polar coordinate system signal by the orthogonal coordinate converter 25.

The address that is input from the delay unit 16 to the LUT 14 is a write address of the distortion correction coefficient written by an adder 24, which will be described below. The write address is an address similar to the above-described read address. The delay unit 16 delays the time for inputting the address to the LUT 14 because the subtractor 20 and a multiplier 22, which will be described below, require time to calculate a distortion correction coefficient that serves as an update value.

The delay unit 17 adds, to the transmission signal x(t), the delay time from when the transmission signal x(t) is input until the feedback signal y(t) is input to the subtractor 20. For example, the delay unit 17 adds, to the transmission signal x(t), a delay time D=D1+D2 that is a result of addition of a delay time D1 in the power amplifier 12 and a delay time D2 in the feedback system 13.

As illustrated in FIG. 4, the radio apparatus 100 includes a polar coordinate converter 18, the polar coordinate converter 19, the subtractor 20, the normalizer 21, the multiplier 22, a delay unit 23, and the adder 24. The polar coordinate converter 18, the polar coordinate converter 19, the subtractor 20, the normalizer 21, the multiplier 22, and the adder 24 correspond to, for example, the distortion correction coefficient arithmetic operator 133 in FIG. 3. The subtractor 20 corresponds to, for example, the calculator 5 in FIG. 1, and the normalizer 21 corresponds to, for example, the normalizer 6 in FIG. 1.

The polar coordinate converter 18 converts the transmission signal x(t) of the orthogonal coordinate system, which is input from the delay unit 17, to a polar coordinate system signal. The polar coordinate converter 18 outputs the transmission signal that is the converted polar coordinate system signal to the subtractor 20.

The polar coordinate converter 19 converts the feedback signal y(t) of the orthogonal coordinate system, which is input from the feedback system 13, to a polar coordinate system signal. The polar coordinate converter 19 outputs the feedback signal that is the converted polar coordinate system signal to the subtractor 20.

The subtractor 20 calculates a difference e(t) between the transmission signal that is input from the polar coordinate converter 18 and the feedback signal that is input from the polar coordinate converter 19. The subtractor 20 outputs the difference e(t) between the transmission signal and the feedback signal to the normalizer 21.

The normalizer 21 normalizes the difference e(t) between the transmission signal and the feedback signal, which is input from the subtractor 20, according to the transmission signal that is input from the polar coordinate converter 18. Specifically, the normalizer 21 divides the power of the difference e(t) by the power of the transmission signal. For example, when the transmission signal x(t) that is input from the polar coordinate converter 18 is "r∠θ", the normalizer 21 divides the power of the difference e(t) by "r" that is an amplification component of the transmission signal "r∠θ". The normalizer 21 then outputs the division result to the multiplier 22. The signal that is output from the normalizer 21 to the multiplier 22 can be referred to as "e(t)/r".

The multiplier 22 multiplies the normalized error signal e(t)/r, which is input from the normalizer 21, by the step-size parameter μ. The step-size parameter μ is a value for gradually updating the distortion correction coefficient and represents an updating rate of the distortion correction coefficient.

The delay unit 23 adds a delay time D to the distortion correction coefficient h(i) that is output from the LUT 14. The delay time D is similar to the delay time D that is added by the delay unit 17 to the transmission signal x(t).

The adder 24 adds the value μ·e(t)/r and the distortion correction coefficient h(i) that is output from the delay unit 23. Accordingly, the adder 24 obtains a distortion correction coefficient that serves as an update value of the distortion correction coefficient h(i) that is stored in the LUT 14. The adder 24 stores the update value in the position that is represented by the write address that is input from the delay unit 16 to the LUT 14.

Figure 5:
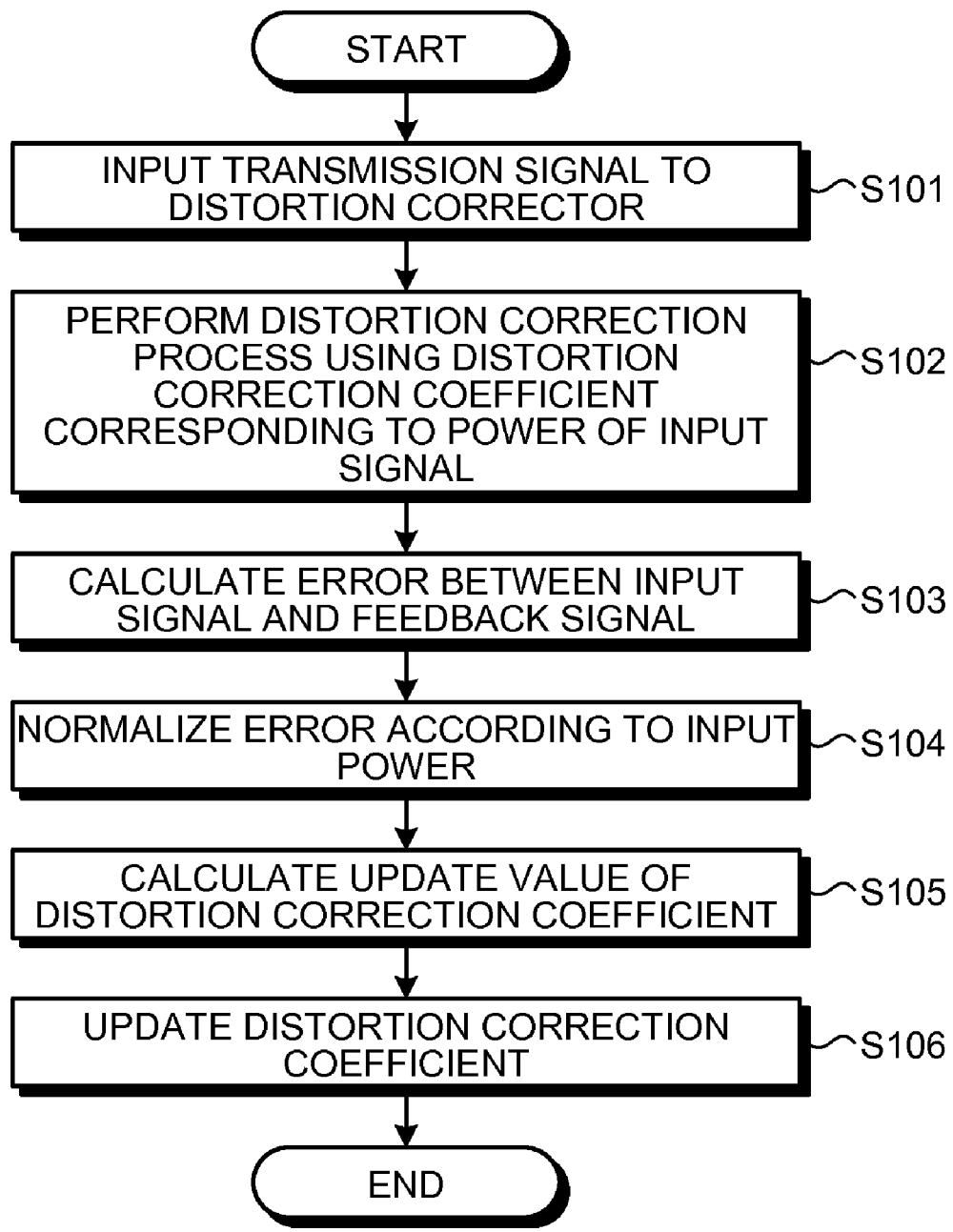
FIG. 5 is a flowchart of a procedure of a distortion correction coefficient update process performed by the radio apparatus according to the second embodiment.

Procedure of Distortion Correction Coefficient Update Process Performed by Radio Apparatus According to Second Embodiment A procedure of the distortion correction coefficient update process, which is performed by the radio apparatus 100 according to the second embodiment, will be described using FIG. 5. FIG. 5 is a flowchart of the procedure of the distortion correction coefficient update process performed by the radio apparatus 100 according to the second embodiment. The distortion correction coefficient update process performed by the units in FIGS. 2 and 3 will be described below.

As illustrated in FIG. 5, the S/P converter 120 of the radio apparatus 100 inputs a transmission signal to the predistortion unit 132 and the distortion correction coefficient arithmetic operator 133 of the distortion corrector 130 (step S101).

The predistortion unit 132 of the distortion corrector 130 acquires the distortion correction coefficient corresponding to the power of the input signal, which is input from the S/P converter 120, from the distortion correction coefficient storage unit 131 and performs the distortion correction process on the input signal using the acquired distortion correction coefficient (step S102). The transmission signal on which the distortion correction process is performed by the distortion corrector 130 is input to the power amplifier 180. The transmission signal whose power is amplified by the power amplifier 180 is emitted to the atmosphere via the antenna 191 and fed back to the distortion correction coefficient arithmetic operator 133 of the distortion corrector 130.

The distortion correction coefficient arithmetic operator 133 calculates a difference between the input signal, which is input from the S/P converter 120, and the feedback signal (step S103). The distortion correction coefficient arithmetic operator 133 then normalizes the difference between the input signal and the feedback signal according to the power of the input signal (step S104). For example, the distortion correction coefficient arithmetic operator 133 divides the difference between the input signal and the feedback signal by the power of the input signal.

The distortion correction coefficient arithmetic operator 133 multiplies the normalized error signal by the step-size parameter μ and then calculates an update value of the distortion correction coefficient by adding the multiplication result to the distortion correction coefficient, which is stored in the distortion correction coefficient storage unit 131 (step S105). At this step, the distortion correction coefficient arithmetic operator 133 acquires a distortion correction coefficient corresponding to the power of the input signal from the distortion correction coefficient storage unit 131.

The distortion correction coefficient arithmetic operator 133 updates the distortion correction coefficient, which corresponds to the input power and stored in the distortion correction coefficient storage unit 131, to the update value of the distortion correction coefficient, which is calculated at step S105 (step S106).

Effects of Second Embodiment

As described above, the radio apparatus 100 according to the second embodiment normalizes the error between the power of the signal that input to the power amplifier 180 (the power amplifier 12) and the power of the output signal that is output from the power amplifier 180 according to the power of the input signal. In other words, when the power of the input signal is large, the radio apparatus 100 normalizes the error according to the power that is a large value. In addition, when the power of the input signal is small, the radio apparatus 100 normalizes the error according to the power that is a small value. Accordingly, even when the power of the input signal is large, the radio apparatus 100 according to the second embodiment can reduce the variation amount of the distortion correction coefficient. In addition, even when the power of the input signal is small, the radio apparatus 100 can prevent the distortion correction coefficient from being not updated. The radio apparatus 100 according to the second embodiment normalizes the error according to the power of the input signal, and the radio apparatus 100 can perform the distortion correction coefficient update process suitable for the input power using the small-scale circuit.

Figure 6:
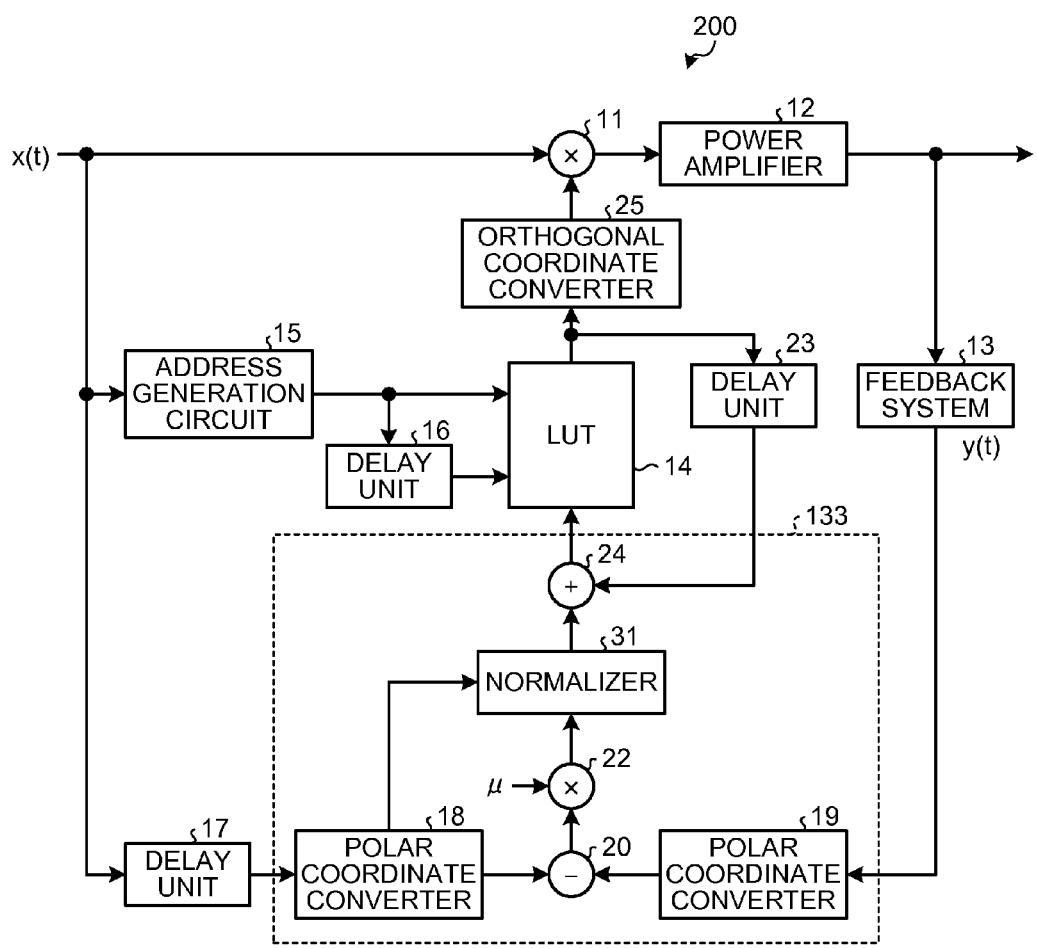
FIG. 6 is a block diagram of an example of the detailed configuration of the radio apparatus according to the second embodiment.
Figure 7:
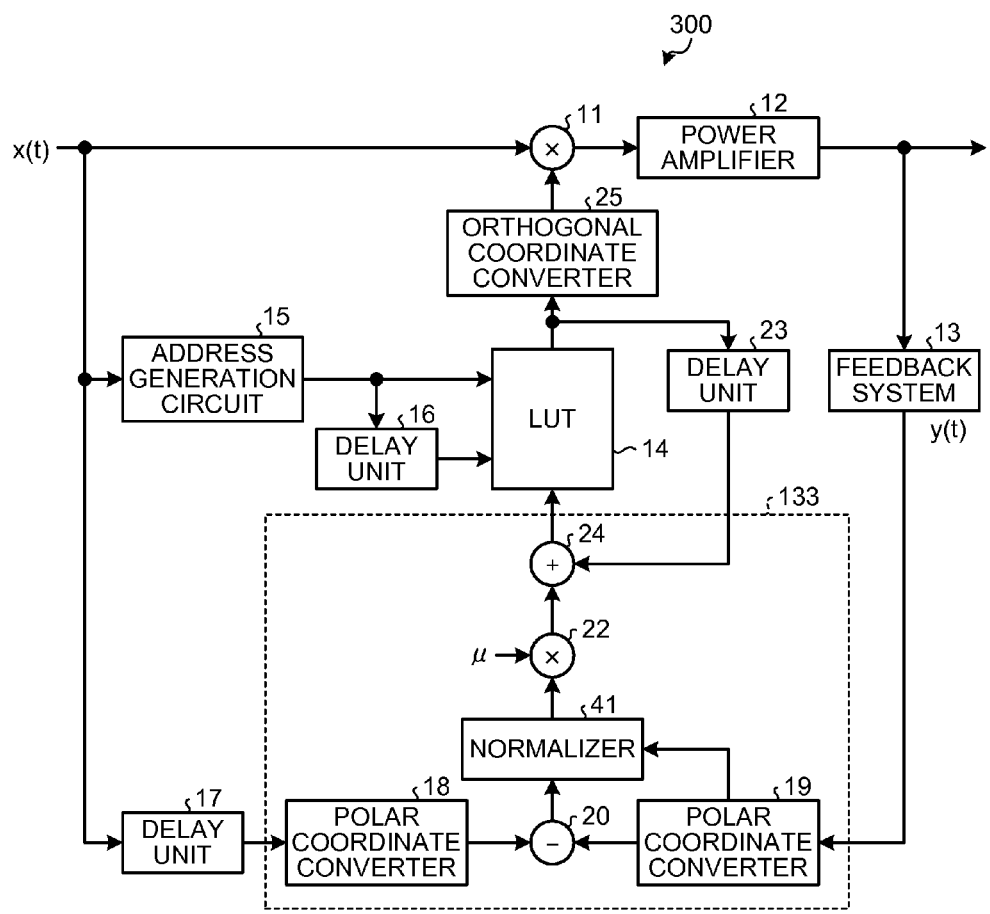
FIG. 7 is a block diagram of an example of the detailed configuration of the radio apparatus according to the second embodiment.
Figure 8:
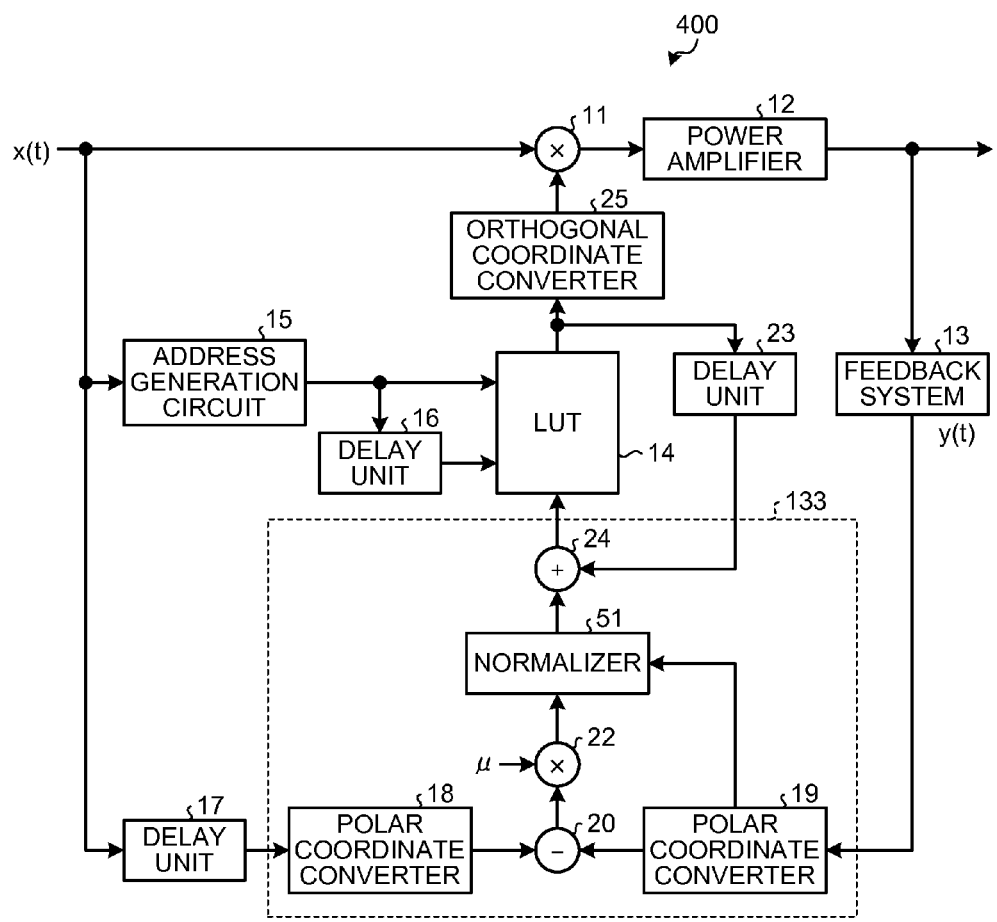
FIG. 8 is a block diagram of an example of the detailed configuration of the radio apparatus according to the second embodiment.
Figure 9:
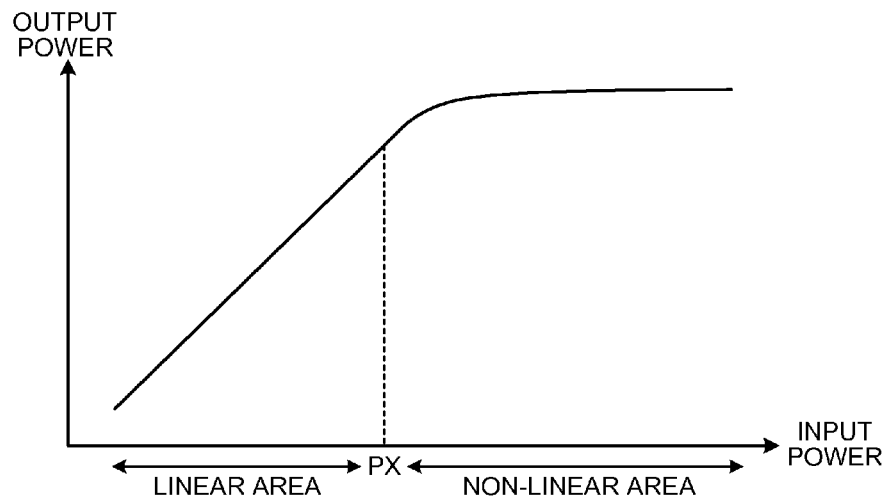
FIG. 9 is a graph of an example of I/O characteristics of a power amplifier.
Figure 10:
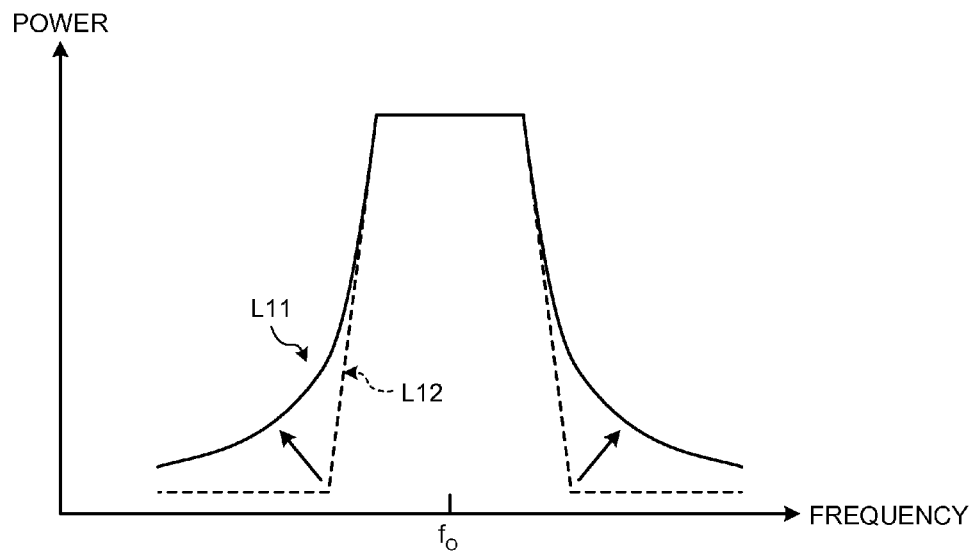
FIG. 10 is a graph of an example of frequency spectrums.

In the second embodiment, the detailed configuration example of the radio apparatus 100 is illustrated in FIG. 4. However, the detailed configuration example of the radio apparatus 100 is not limited to the example illustrated in FIG. 4. FIGS. 6 to 8 illustrate other examples of the detailed configuration of the radio apparatus 100. Units having the same functions as those of the above-described units are denoted by the same reference numerals of the above-described units and the detailed description thereof will be omitted below.

Compared to the radio apparatus 100 in FIG. 4, a radio apparatus 200 in FIG. 6 includes a normalizer 31 instead of the normalizer 21. The normalizer 31 normalizes a signal μ·e(t) obtained by multiplying a difference e(t) between an input signal and a feedback signal by a step-size parameter μ. The radio apparatus 200 may normalize an error signal that is multiplied by the step-size parameter μ.

Compared to the radio apparatus 100 in FIG. 4, a radio apparatus 300 in FIG. 7 includes a normalizer 41 instead of the normalizer 21. The normalizer 41 normalizes a difference e(t), which is input from the subtractor 20, between a transmission signal and a feedback signal, which is input from the polar coordinate converter 19, according to the feedback signal. For example, the normalizer 41 divides the difference e(t) between the transmission signal and the feedback signal, which is input from the subtractor 20, by the power of the feedback signal. As described above, the radio apparatus 300 may perform normalize the difference according to the power of the feedback signal.

Compared to the radio apparatus 300 in FIG. 7, a radio apparatus 400 in FIG. 8 includes a normalizer 51 instead of the normalizer 41. The normalizer 51 normalizes a signal μ·e(t), which is input from the multiplier 22, according to a feedback signal that is input from the polar coordinate converter 19. As described above, the radio apparatus 400 may normalize the error signal, which is multiplied by a step-size parameter μ, according to the power of the feedback signal.

The process procedure, control procedure, specific names, and information including various types of data and parameters (for example, FIG. 5) can be arbitrarily changed unless otherwise noted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A radio apparatus comprising:
a power amplifier that amplifies a power of an input signal;
a storage unit that stores a distortion correction coefficient for correcting distortion occurring in the power amplifier, the distortion correction coefficient being stored in association with power of the input signal;
a distortion corrector that acquires a distortion correction coefficient corresponding to the power of the input signal from the storage unit and performs a distortion correction process on the input signal using the acquired distortion correction coefficient;
a calculator that calculates an error between the power of the input signal and a power of an output signal output from the power amplifier;
a normalizer that normalizes the calculated error according to lager power as the power of the input signal or the power of the output signal is larger; and
an update unit that updates the distortion correction coefficient stored in the storage unit in association with the power of the input signal, using the normalized error.
2. The radio apparatus according to claim 1, further comprising a multiplier that multiplies a rate for updating the distortion correction coefficient by the calculated error,
wherein the normalizer normalizes a result of the multiplying by the multiplier according to the lager power as the power of the input signal or the power of the output signal is larger.

3. The radio apparatus according to claim 1, further comprising a multiplier that multiplies the normalized error by a rate for updating the distortion correction coefficient,
wherein the update unit updates the distortion correction coefficient stored in the storage unit in association with the power of the input signal, using a result of the multiplying by the multiplier.

4. The radio apparatus according to claim 1, wherein the normalizer divides the calculated error by the power of the input signal or the power of the output signal.

5. A distortion correction apparatus comprising:
a storage unit that stores a distortion correction coefficient for correcting distortion occurring in a power amplifier, the distortion correction coefficient being stored in association with power of an input signal input to the power amplifier;
a distortion corrector that acquires a distortion correction coefficient corresponding to the power of the input signal from the storage unit and performs a distortion correction process on the input signal using the acquired distortion correction coefficient;
a calculator that calculates an error between the power of the input signal and a power of an output signal output from the power amplifier;
a normalizer that normalizes the calculated error according to lager power as the power of the input signal or the power of the output signal is larger; and
an update unit that updates the distortion correction coefficient stored in the storage unit in association with the power of the input signal, using the normalized error.

6. A distortion correction method of correcting a distortion occurring in a power amplifier, the distortion correction method comprising:
acquiring a distortion correction coefficient corresponding to power of an input signal input to the power amplifier, from a storage unit that stores a distortion correction coefficient for correcting distortion occurring in the power amplifier, the distortion correction coefficient being stored in association with power of the input signal;
performing a distortion correction process on the input signal using the acquired distortion correction coefficient;
calculating an error between the power of the input signal and a power of an output signal output from the power amplifier;
normalizing the calculated error according to lager power as the power of the input signal or the power of the output signal is larger; and
updating the distortion correction coefficient stored in the storage unit in association with the power of the input signal, using the normalized error.

* * * * *